(12) United States Patent
Aliane et al.

(10) Patent No.: US 10,008,619 B2
(45) Date of Patent: Jun. 26, 2018

(54) PHOTOSENSITIVE AND HEAT-RESISTANT MATERIAL, METHOD FOR PRODUCING SAME AND USE THEREOF

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Mohammed Benwadih, Champigny sur Marne (FR)

(73) Assignee: Commissariat a l'Energie Atomique et aux Energies, Paris (FR)

( * ) Notice: Subject to any disclaimer, the term of this patent is extended or adjusted under 35 U.S.C. 154(b) by 0 days. days.

(21) Appl. No.: 14/388,504

(22) PCT Filed: Mar. 29, 2013

(86) PCT No.: PCT/FR2013/050713
§ 371 (c)(1),
(2) Date: Sep. 26, 2014

(87) PCT Pub. No.: WO2013/156705
PCT Pub. Date: Oct. 24, 2013

(65) Prior Publication Data
US 2015/0053895 A1    Feb. 26, 2015

(30) Foreign Application Priority Data
Apr. 20, 2012 (FR) .................... 12 53653

(51) Int. Cl.
*H01L 31/0288* (2006.01)
*H01C 7/00* (2006.01)
(Continued)

(52) U.S. Cl.
CPC .......... *H01L 31/0288* (2013.01); *C01G 19/00* (2013.01); *C01G 19/02* (2013.01);
(Continued)

(58) Field of Classification Search
CPC ..... H01L 31/0288; H01C 7/008; H01C 7/006; H01C 17/06533; C01G 19/00;
(Continued)

(56) References Cited

U.S. PATENT DOCUMENTS 9,219,239 B2 * 12/2015 Huang .................... H01L 51/44
2001/0016261 A1 * 8/2001 Kondo .................. B01D 61/44
428/426
(Continued)

FOREIGN PATENT DOCUMENTS

KR    20110113873 A    10/2011

OTHER PUBLICATIONS

Tae Hoon Seo et al. Applied Physics Letters, 98, 251114 (2011).*
(Continued)

*Primary Examiner* — Peter F Godenschwager
*Assistant Examiner* — Andrew J. Oyer
(74) *Attorney, Agent, or Firm* — Forge IP, PLLC

(57) ABSTRACT

A tin-based material includes: from 50 to 100 wt. parts of grapheme; from 0 to 50 wt. parts of antimony-doped tin dioxide (ATO); from 0 to 50 wt. parts of indium-doped tin dioxide (ITO). The material includes at least ATO and/or ITO.

16 Claims, 1 Drawing Sheet

(51) Int. Cl.
  *H01C 17/065* (2006.01)
  *C01G 19/02* (2006.01)
  *C01G 19/00* (2006.01)

(52) U.S. Cl.
  CPC ............ *H01C 7/006* (2013.01); *H01C 7/008* (2013.01); *H01C 17/06533* (2013.01); *C01P 2006/32* (2013.01); *C01P 2006/40* (2013.01); *C01P 2006/60* (2013.01)

(58) Field of Classification Search
  CPC .. C01G 19/02; C01P 2006/32; C01P 2006/60; C01P 2006/40
  See application file for complete search history.

(56) References Cited

U.S. PATENT DOCUMENTS

| | | | | |
|---|---|---|---|---|
| 2001/0019244 A1* | 9/2001 | Yamazaki | ............... | H05B 33/28 313/506 |
| 2003/0222074 A1* | 12/2003 | Baba | ..................... | A47J 41/005 219/407 |
| 2008/0117177 A1* | 5/2008 | Ko | ........................ | G06F 3/0416 345/173 |
| 2011/0080368 A1* | 4/2011 | Lee | ........................ | G06F 3/045 345/174 |
| 2011/0101365 A1* | 5/2011 | Kim | ................... | H01L 29/78684 257/66 |
| 2012/0049901 A1* | 3/2012 | Takewaki | ........... | H03K 19/0016 327/109 |

OTHER PUBLICATIONS

Tae Hoon Seo, et. al.; "Graphene network on indium tin oxide nanodot nodes for transparent and current spreading electrode in InGaNGaN light emitting diode"; Applied Physics Letters 98. 251114 (2011); pp. 251114-1-251114-3.

International Search Report Application No. PCT/FR2013/050713 Completed: Jul. 2, 2013; dated Jul. 7, 2013 pp. 3.

H.N. Lim, et. al.; "Preparation and characterization of tin oxide, Sno2 nanoparticles decorated graphene"; Ceramics International 38 (2012) 4209-4216.

Guihua Yu, et. al.; "Solution-Processed Graphene MnO2 Nanostructured Textiles for High-Performance Electrochemical Capacitors"; ACS Publications 2011 American Chemical Society; pp. 2905-2911.

\* cited by examiner

Variation of R according to the temperature of the mixture by weight of 50% of graphene with 50% of ATO

PHOTOSENSITIVE AND HEAT-RESISTANT MATERIAL, METHOD FOR PRODUCING SAME AND USE THEREOF

FIELD OF THE INVENTION

The present invention relates to a photosensitive and heat-resistant material based on graphene and tin oxide. The field of use of the invention comprises tactile applications, such as, in particular, implemented in displays, keyboards, touch pads, etc.

BACKGROUND OF THE INVENTION

The resistivity of photoresistive or photosensitive materials varies according to the quantity of incident light. In other words, the resistance decreases as the incident light increases.

Prior art photoresistive materials generally comprise elements from groups II to VI of the periodic table of elements. For example, cadmium sulfide (CdS) or cadmium selenide (CdSe) are currently used in applications in the visible range, particularly due to their low cost. However, such materials are generally unfit for infrared applications. In this case, lead sulfide (PbS) may then be used.

Further, prior art materials have many disadvantages, among which their lack of stability in time, or their relatively long response time when the luminosity varies.

As for heat-resistant materials, their resistance or resistivity varies according to temperature. These materials may be based on metals or metal oxides. Unlike photoresistors, thermistors are generally stable along time.

The material developed by the Applicant is capable of sensing in the visible range as well as in near infrared. Further it has an electric resistance which decreases according to quantity of captured radiation. This material also enables to detect heat variations capable of reflecting as variations of the near infrared radiation emitted by a finger in the context of a tactile application.

SUMMARY OF THE INVENTION

The Applicant has developed a new photoresistive and heat-resistant material based on tin and carbon.

Unlike graphene, this material has the double advantage, on the one hand, of being sensitive to a wide radiation spectrum, particularly at the wavelengths of the visible spectrum and of the near infrared spectrum and, on the other hand, of having an electric resistance which decreases according to the quantity of collected radiation. In the context of a tactile application, it may in particular be a finger, which emits a significant quantity of infrared radiation. The variation of the photosensitive radiation can thus be detected even if the ambient visible light is very low.

More specifically, the present invention relates to a tin-based material, comprising:
from 100 to 50 wt. parts of grapheme;
from 0 to 50 wt. parts of antimony-doped tin dioxide (ATO);
from 0 to 50 wt. parts of indium-doped tin dioxide (ITO).

The material forming the object of the invention thus comprises graphene, ATO and/or ITO. In other words, said material necessarily comprises graphene, but also at least ATO and/or ITO.

For more clarity, it is specified that the quantities expressed in wt. parts advantageously have as a reference a quantity between 100 and 200 wt. parts of tin-based material. In other words, the tin-based material advantageously comprises, for 100 to 200 wt. parts of material:
from 100 to 50 wt. parts of grapheme;
from 0 to 50 wt. parts of antimony-doped tin dioxide (ATO);
from 0 to 50 wt. parts of indium-doped tin dioxide (ITO).

The presence of tin by incorporation of tin dioxide doped either with antimony, or with indium, enables to modulate the sensitivity of the material, be it in terms of detection sensitivity to light or of resistance variation according to temperature. It will thus be within the abilities of those skilled in the art to adjust the respective quantities according to the final use of the material.

However, according to a preferred embodiment, the material comprises from 10 to 20 wt. parts of ATO and/or of ITO for from 80 to 90 wt. parts of graphene.

According to another specific embodiment, the tin-based material comprises 20 wt. parts of ATO and/or of ITO and 80 wt. parts of graphene, advantageously for 100 wt. parts of material.

The material forming the object of the invention may comprise chemical bonds between its components. Thus, without making any assumption, it is possible for its heat resistance and photoresistance properties to result from the presence of such chemical bonds.

Graphene is a bi-dimensional carbon crystal. The three-dimensional stack of graphene layers forms graphite.

Antimony-doped tin dioxide (ATO) has a Sn/Sb weight ratio advantageously in the range from 5 to 10. The formula of ATO advantageously is $SnO_2:Sb_2O_3$, or $SnO_2:Sb_2O_5$. More advantageously still, it is $SnO_2:Sb_2O_3$.

As for indium-doped tin dioxide (ITO), it has a Sn/In weight ratio advantageously in the range from 5 et 10. ITO advantageously corresponds to formula $SnO_2:In_2O_3$, or $SnO_2:In_2O_5$. More advantageously still, it is $SnO_2: In_2O_3$.

Generally in the tin-based material forming the object of the invention, the graphene/ATO and/or ITO weight ratio is in the range from 1 to 5, more advantageously still from 3 to 4. In other words, the graphene weight amounts to from 1 to 5 times the weight of ATO and/or of ITO, and more advantageously still from 3 to 4 times. According to a specific embodiment, this ratio may be equal to 4.

Advantageously, the material forming the object of the invention comprises either ATO or ITO.

Further, according to a specific embodiment, the material forming the object of the invention may comprise metal and/or semiconductor nanoparticles.

The nanoparticles, according to their conduction properties, may enable to modulate the electric conductivity of the material forming the object of the present invention.

Further, nanoparticles, and more particularly metal oxide or semiconductor nanoparticles, are very sensitive to light and can thus contribute to modulating the optical absorption of the material.

Advantageously, without this being a limitation, the nanoparticles may have a spherical shape and a diameter in the range from 10 to 100 nanometers, more advantageously still from 20 to 50 nanometers.

However, it will be within the abilities of those skilled in the art to adapt their shape and size according to the desired properties to modulate the performance of the material, particularly to increase the sensitivity of the material to light.

According to a preferred embodiment, the nanoparticles are formed of a mixture of metal nanoparticles and of metal oxide nanoparticles, amounting to from 1 to 10 wt. parts with respect to the weight of the material. The nanoparticles may in particular be selected from the group comprising silver, $In_2O_3$, InZnO, ZnO, CuO, NiO nanoparticles, and mixtures thereof.

According to another preferred embodiment, the nanoparticles are formed of a mixture of metal nanoparticles and of semiconductor nanoparticles, amounting to from 1 to 5 wt. parts with respect to the weight of the material. It may in particular be a mixture of silver nanoparticles and of InGaZnO.

Thus, the electric resistance may be modulated to increase the detection sensitivity.

The present invention also relates to a method of preparing the above-described material based on graphene and ATO and/or ITO, according to the steps of:
preparing a graphene ink;
preparing an ink of tin dioxide doped with antimony and/or indium;
adding graphene ink and ink of tin dioxide doped with antimony and/or indium;
adding, if need be, a mixture of metal nanoparticles and of metal oxide nanoparticles or a mixture of metal nanoparticles and of semiconductor nanoparticles;
stirring the obtained mixture, preferably at a temperature in the range from 30 to 60° C.;
drying the mixture, advantageously by evaporation of the solvents, to provide the material based on graphene and on ATO and/or ITO.

In the case of the preparation of a material comprising ATO and ITO, the ink based on tin dioxide may comprise ATO or ITO. According to another embodiment, two different inks may be prepared and added simultaneously or not.

The stirring of the mixture is advantageously mechanical and enables to homogenize said mixture.

According to a specific embodiment, the ink based on tin dioxide may comprise from 60 to 80% by weight of ATO and/or of ITO dispersed in at least one solvent. The solvent may be selected from the group particularly comprising cyclopentanone, ethyl acetate, tetrahydrofuran, 3-hexanone, 2-pentanone.

On the other hand, the graphene ink may comprise from 40 to 80% by weight of graphene in at least one solvent. The solvent may particularly be cyclohexanone, cyclopentanone.

However, the different inks used in the context of the invention may also be based on aqueous solutions.

Further, it will be within the abilities of those skilled in the art to adjust the respective concentrations of the graphene and ATO and/or ITO inks. The above-specified values are indicative and should by no means limit the invention.

The present invention also relates to a photoresistor and a thermistor comprising the above-described material.

The preparation of the photoresistor or of the thermistor forming the object of the invention is implemented, in particular, by deposition on a substrate of the mixture comprising the ATO and/or ITO ink, the graphene ink, and possibly nanoparticles.

Advantageously, the substrate is made of a material at least partly transparent to visible light. It can thus be PEN (poly(ethylene 2,6-naphthalate)), or PET (polyethylene terephthalate). This type of substrate has the triple advantage of being flexible, transparent to the visible spectrum and to near infrared, and of having a low cost.

Further, the substrate may advantageously have a thickness in the range from 25 micrometers and 200 micrometers.

The deposition of the mixture comprising the photoresistive and/or heat-resistant material may be performed by silk screening, by inkjet, or by any other deposition technique known by those skilled in the art.

The thickness of the deposition may be in the range from 100 nanometers to several micrometers. It will be within the abilities of those skilled in the art to adjust this thickness according to the targeted application.

The deposition of the mixture is advantageously followed by an anneal step that may be performed at a temperature in the range from 100 to 120° C., for a time period in the range from 10 to 60 minutes. It will be within the abilities of those skilled in the art to adjust the conditions (duration and temperature) according to the substrate, to the deposition thickness, and other parameters.

Generally, solvents of graphene ink and of ATO and/or ITO ink advantageously have close evaporation temperatures to form a very uniform deposited layer. Such evaporation temperatures are also advantageously compatible with the anneal temperature. Particularly, the evaporation temperatures may advantageously be in the range from 110 to 180° C.

The anneal step particularly enables to remove the solvents present in the inks used to prepare the photoresistor or the thermistor.

As already indicated, the tin-based material forming the object of the invention comprises graphene, ATO and/or ITO. In other words, said material necessarily comprises graphene, but also at least ATO or ITO. The material comprises a non-zero quantity of ATO or ITO. Thus, when the material comprises 0 part of ITO, it necessarily comprises x parts of ATO, with $0<x\leq50$.

Similarly, when the material comprises 0 part of ATO, it necessarily comprises y parts of ITO, with $0<y\leq50$.

For 100 to 200 wt. parts of material, said material advantageously comprises:
from 100 to 50 wt. parts of grapheme;
$0\leq x\leq 50$ wt. parts of antimony-doped tin dioxide (ATO);
$0\leq y\leq 50$ wt. parts of indium-doped tin dioxide (ITO);
when x+y is different from 0.

According to a specific embodiment, x+y may be equal to 5, 10, 15, 20, 25, 30, 35, 40, 45, 50, 55, 60, 65, 70, 75, 80, 85, 90, 95, or 100, with x+y≠0. x+y may be between two of these values. For example, x+y may be in the range from 5 to 100, from 10 to 50, or from 10 to 85.

The invention and the resulting advantages will better appear from the following non-limiting drawings and examples, provided as an illustration of the invention.

DETAILED DESCRIPTION OF THE INVENTION

Preparation of the photoresistive and heat-resistant material according to the invention A graphene ink is prepared by dispersing 6 g of graphene (VORBECK) in 10 ml of cyclopentanone, for example.

Concurrently, an ATO ink is prepared by dispersing 6 g of ATO (DUPONT) in 10 ml of cyclopentanone.

The graphene and ATO inks are then mixed to obtain a graphene/ATO weight ratio of 4.

This mixture is then added from 0 to 10 mg of a mixture of silver, $In_2O_3$, InZnO, ZnO, CuO, NiO nanoparticles, or of silver and InGaZnO nanoparticles according to another embodiment.

The resulting mixture is then mechanically stirred at a 60° C. temperature.

The obtained solution is then dried by evaporation of the solvents at 100° C., under air.

Preparation of a photoresistor or of a thermistor according to the invention

The mixture obtained hereabove is deposited, before evaporation of the solvents, on a substrate by silk screening.

The PEN substrate has a 125-micrometer thickness while 5 micrometers of mixture have been deposited.

After the deposition of the mixture, an anneal is carried out at a 100° C. temperature for 20 minutes.

Figure 1:
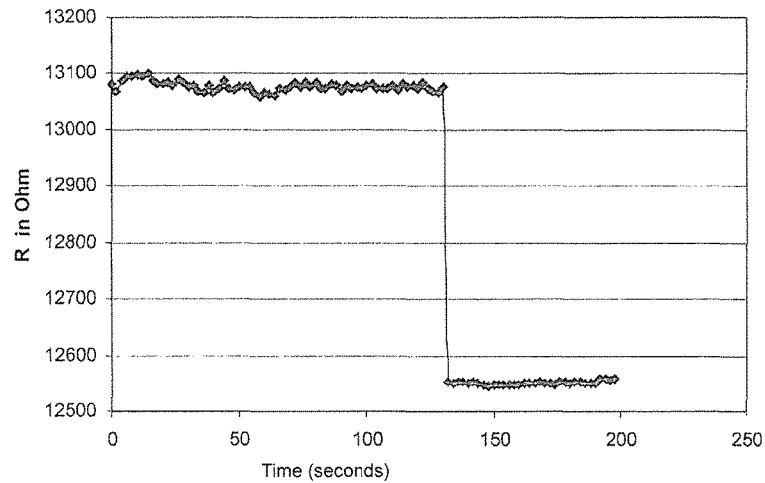
FIG. 1 illustrates the resistance of the material forming the object of the invention according to its exposure to visible daylight.

The photosensitivity properties of the photoresistor are illustrated in FIG. 1. Indeed, the resistance of this material varies from nearly 13,000 ohms when it is not exposed to light to 12,000 ohm when it is exposed to daylight. This material has an extremely short reaction time, in the order of from 1 microsecond to 10 ms.

Figure 2:
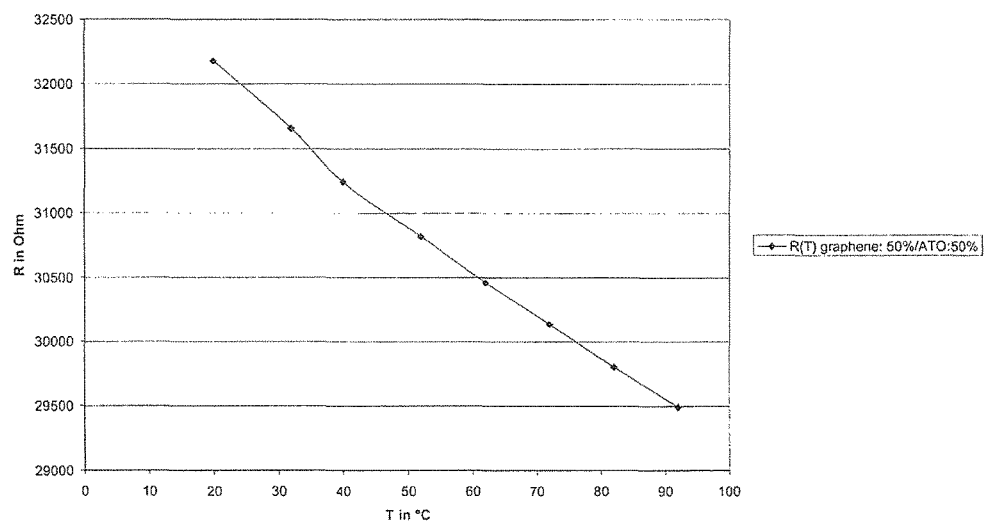
FIG. 2 shows the resistance variation according to temperature for a material comprising 50% by weight of graphene and 50% by weight of ATO.

The resistance variation of this material according to temperature is illustrated in FIG. 2. The resistance of the material regularly decreases as the temperature increases. While the resistance of the material is greater than 32,000 ohm at 20° C., it is equal to 29,500 ohm at 90° C.

The invention claimed is:

1. A tin-based material, consisting of a mixture of:
   from 50 to 100 wt. parts of graphene;
   from 0 to 50 wt. parts of antimony-doped tin dioxide (ATO);
   from 0 to 50 wt. parts of indium-doped tin dioxide (ITO);
   said material comprising at least one of ATO and ITO,
   wherein the tin-based material has a weight ratio between graphene and the at least one of ATO and ITO in the range from 1 to 5,
   and wherein the tin-based material comprises chemical bonds between its components affording heat resistance and photoresistance properties to the tin-based material.

2. The material of claim 1, wherein the weight ratio between graphene and the at least one of ATO and ITO is in the range from 3 to 4.

3. The material of claim 1, wherein the ATO and the ITO respectively have a Sn/Sb and Sn/In weight ratio in the range from 5 to 10.

4. The material of claim 1, wherein the ATO corresponds to formula $SnO_2:Sb_2O_3$, or $SnO_2:Sb_2O_5$.

5. The material of claim 1, wherein the ITO corresponds to formula $SnO_2:In_2O_3$, or $SnO_2:In_2O_5$.

6. A method of preparing the material based on graphene and ATO and/or ITO of claim 1, according to the steps of:
   preparing a graphene ink;
   preparing an ATO and/or ITO ink;
   adding the graphene ink and the ATO and/or ITO ink;
   adding, if need be, a mixture of metal nanoparticles and of metal oxide nanoparticles or a mixture of metal nanoparticles and of semiconductor nanoparticles;
   stirring the obtained mixture;
   drying the mixture to provide the material based on graphene and on ATO and/or ITO.

7. The method of claim 6, wherein the stirring of the obtained material is performed at a temperature in the range from 30 to 60° C.

8. The method of claim 6, wherein the drying of the mixture is performed by evaporating the solvents.

9. A photoresistor comprising the material of claim 1.

10. A thermistor comprising the material of claim 1.

11. A tin-based material, consisting of:
    from 50 to 100 wt. parts of graphene;
    from 0 to 50 wt. parts of antimony-doped tin dioxide (ATO);
    from 0 to 50 wt. parts of indium-doped tin dioxide (ITO);
    said material comprising at least one of ATO and ITO; and
    metal and/or semiconductor nanoparticles,
    wherein the tin-based material has a weight ratio between graphene and the at least one of ATO and ITO in the range from 1 to 5,
    and wherein the tin-based material comprises chemical bonds between its components affording heat resistance and photoresistance properties to the tin-based material.

12. The material of claim 11, further comprising from 1 to 10 wt. parts of a mixture of metal nanoparticles and of metal oxide nanoparticles.

13. The material of claim 12, wherein the mixture of metal nanoparticles and of metal oxide nanoparticles comprises nanoparticles selected from the group consisting of silver, $In_2O_3$, InZnO, ZnO, CuO, NiO nanoparticles, and mixtures thereof.

14. The material of claim 11, further comprising from 1 to 5 wt. parts of a mixture of metal nanoparticles and of semiconductor nanoparticles.

15. The material of claim 14, wherein the mixture of metal nanoparticles and of semiconductor nanoparticles comprises silver and InGaZnO nanoparticles.

16. A homogeneous tin-based material, consisting of a mixture of:
    from 50 to 100 wt. parts of graphene;
    from 0 to 50 wt. parts of antimony-doped tin dioxide (ATO);
    from 0 to 50 wt. parts of indium-doped tin dioxide (ITO);
    said material comprising at least one of ATO and ITO,
    wherein the tin-based material has a weight ratio between graphene and the at least one of ATO and ITO in the range from 1 to 5,
    and wherein the tin-based material comprises chemical bonds between its components affording heat resistance and photoresistance properties to the tin-based material.

* * * * *